United States Patent
Donnell et al.

(10) Patent No.: US 11,309,207 B2
(45) Date of Patent: Apr. 19, 2022

(54) GROUNDING MECHANISM FOR MULTI-LAYER FOR ELECTROSTATIC CHUCK, AND RELATED METHODS

(71) Applicant: ENTEGRIS, INC., Billerica, MA (US)

(72) Inventors: Steven Donnell, Burlington, MA (US); Jakub Rybczynski, Arlington, MA (US); Chun Wang Chan, Cambridge, MA (US); Yan Liu, Lexington, MA (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/938,547

(22) Filed: Jul. 24, 2020

(65) Prior Publication Data
US 2021/0028046 A1    Jan. 28, 2021

Related U.S. Application Data

(60) Provisional application No. 62/877,919, filed on Jul. 24, 2019.

(51) Int. Cl.
*H01T 23/00*    (2006.01)
*H01L 21/683*    (2006.01)

(52) U.S. Cl.
CPC .................. *H01L 21/6833* (2013.01)

(58) Field of Classification Search
None
See application file for complete search history.

(56) References Cited

U.S. PATENT DOCUMENTS

| | | |
|---|---|---|
| 7,623,334 B2 | 11/2009 | Mizuno |
| 9,692,325 B2 | 6/2017 | Suuronen |
| 10,292,209 B2 | 5/2019 | Takebayashi |
| 2009/0284894 A1 | 11/2009 | Cooke |
| 2013/0155569 A1 | 6/2013 | Suuronen |
| 2015/0294891 A1 | 10/2015 | Lin |
| 2020/0161158 A1* | 5/2020 | Liu .................. H01L 21/68757 |

* cited by examiner

*Primary Examiner* — Stephen W Jackson
(74) *Attorney, Agent, or Firm* — Entegris, Inc.

(57) ABSTRACT

Described are multi-layer electrostatic chucks used to secure and support a wafer substrate during wafer processing, and related methods, wherein the chuck includes a grounding structure that includes a grounding layer and a grounding pin.

11 Claims, 2 Drawing Sheets

GROUNDING MECHANISM FOR MULTI-LAYER FOR ELECTROSTATIC CHUCK, AND RELATED METHODS

CROSS-REFERENCE TO RELATED APPLICATION

This application claims priority to and the benefit of U.S. Provisional Application No. 62/877,919 filed on Jul. 24, 2019, the contents of which are incorporated by reference herein for all purposes.

TECHNICAL FIELD

This disclosure generally relates to electrostatic chucks used to secure and support a wafer substrate during wafer processing.

BACKGROUND

Electrostatic chucks (also referred to simply as "chucks," for short) are used in semiconductor wafer and microelectronic device processing. The chuck holds a workpiece such as a semiconductor wafer or microelectronic device substrate, in place, securely, to perform processes on a surface of the workpiece. The upper surface of the chuck, referred to sometimes as a "substrate-support surface," can include a specialize feature to improve the performance of the chuck. One such feature is a conductive coating, which may be used to provide an electric connection between the workpiece and electrical ground.

The conductive coating, in one particular use, can be effective to remove an electrostatic charge from the workpiece, or to prevent accumulation of an electrostatic charge at the workpiece. During processing of a workpiece, the workpiece may be exposed to electrostatic charge, which can tend to accumulate. Charge accumulation can create an electrostatic attraction between the chuck and the workpiece, causing the workpiece to "stick" to the chuck after processing, at a time when the workpiece is desirably removed from the chuck.

Charge accumulation may be sufficient to hinder a step of removing the workpiece from the chuck. Lift pins of an electrostatic chuck device are normally (absent a significant buildup of electrostatic charge) sufficient to lift the workpiece away from the chuck by being raised to contact and lift the underside (bottom) of the workpiece away from the chuck. But if charge accumulation is sufficient, lift pins may be able to lift one side of the workpiece, while a remaining portion continues to contact the chuck. When the workpiece is a disk-shaped semiconductor wafer, the wafer may become "tilted," appearing stuck to an edge of the chuck. When an associated robot arm attempts to retrieve the wafer, the arm may not properly engage the wafer and may accidentally push the wafer off of the chuck, which may cause damage to the wafer as well as an interruption in the processing.

Even if charge accumulation does not lead to a workpiece "sticking" problem, it may lead to damage of microelectronic structures being formed on the workpiece. In a plasma doping ion implanter where the workpiece is positioned in the same chamber as plasma, excessive charge accumulation can also lead to doping non-uniformities, micro-loading, and arcing. Hence, the throughput of the plasma doping ion implanter may need to be intentionally limited in some instances to avoid excessive charge accumulation.

One technique for controlling, preventing, or dissipating charge accumulation of a workpiece that is supported by an electrostatic chuck involves placing a conductive coating at the surface of the chuck to contact the workpiece and provide a conductive path to electrical ground. The conductive coating, electrically connected to ground, prevents or eliminates electrostatic charge build-up (relative to ground) of the workpiece.

SUMMARY

The following description relates to structures and methods that involve a multi-layer structure of an electrostatic chuck, or a precursor thereof, the multi-layer structure including a grounding structure for a conductive coating of the multi-layer structure.

The grounding structure involves a grounding layer included as part of a multi-layer chuck structure or a precursor thereof, that is connected to the conductive coating. The grounding layer is also connected to a ground path that connects to electrical ground, and that includes a grounding pin. The grounding pin passes through other layers of the multi-layer structure located below the grounding layer, and connects electrically to the grounding layer from a location below the grounding layer. Those layers may include a bonding layer, which may be non-conductive adhesive (e.g., polymeric), an insulator layer, and optional other additional layers.

In contrast, previous grounding path structures include a thin metal film placed over an outside diameter surface of a multi-layer chuck as shown in the example of FIG. 2. These previous thin film structures adhere to the outer diameter surface at vertical edge surfaces of the different layers, including at locations that traverse an interface between two layers, e.g., an interface of a polymer layer and an insulator. This type of thin film grounding path, at this location especially, may be susceptible to delamination or other separation from the surface during use or over time. According to the present description, Applicant has identified an alternate ground path that involves a grounding pin that is not deposited onto the outer diameter surface of a multi-layer chuck, and that is not at risk of delamination from that surface. The grounding path uses a grounding pin to pass through layers of the multi-layer chuck structure located below the grounding layer, and connects electrically to the grounding layer from a location below the grounding layer.

In one embodiment, the disclosure relates to a multi-layer electrostatic chuck assembly, including precursors thereof. The assembly includes: a dielectric layer; a conductive field coating above the dielectric layer; an electrode layer below the dielectric layer, an insulator layer below the electrode layer; a polymeric bonding layer below the dielectric layer and above the insulator layer; a grounding layer above the polymeric bonding layer, below the dielectric layer, and electrically connected to the conductive field coating; a grounding pin opening extending from a location of the insulator, through the polymeric bonding layer to the grounding layer; and a grounding pin located in the grounding pin opening. The grounding pin is electrically connected to the grounding layer.

In another embodiment, the disclosure relates to a method of placing a grounding pin in a multi-layer structure. The multi-layer structure includes: a dielectric layer; an electrode layer disposed below the dielectric layer; an insulator layer below the electrode layer; a polymeric bonding layer disposed below the dielectric layer and the electrode layer and above the insulator layer; and a grounding layer disposed above the polymeric bonding layer, below the dielectric layer, and electrically connected to the field coating. The method includes: forming a grounding pin opening in the multi-layer structure that extends from a location of the insulator, through the polymeric bonding layer, and to the grounding layer; and inserting a grounding pin into the grounding pin opening and electrically connecting the grounding pin to the grounding layer.

BRIEF DESCRIPTION OF THE DRAWINGS

The disclosure may be more completely understood in consideration of the following description of various illustrative embodiments in connection with the accompanying drawings

Figure 1:
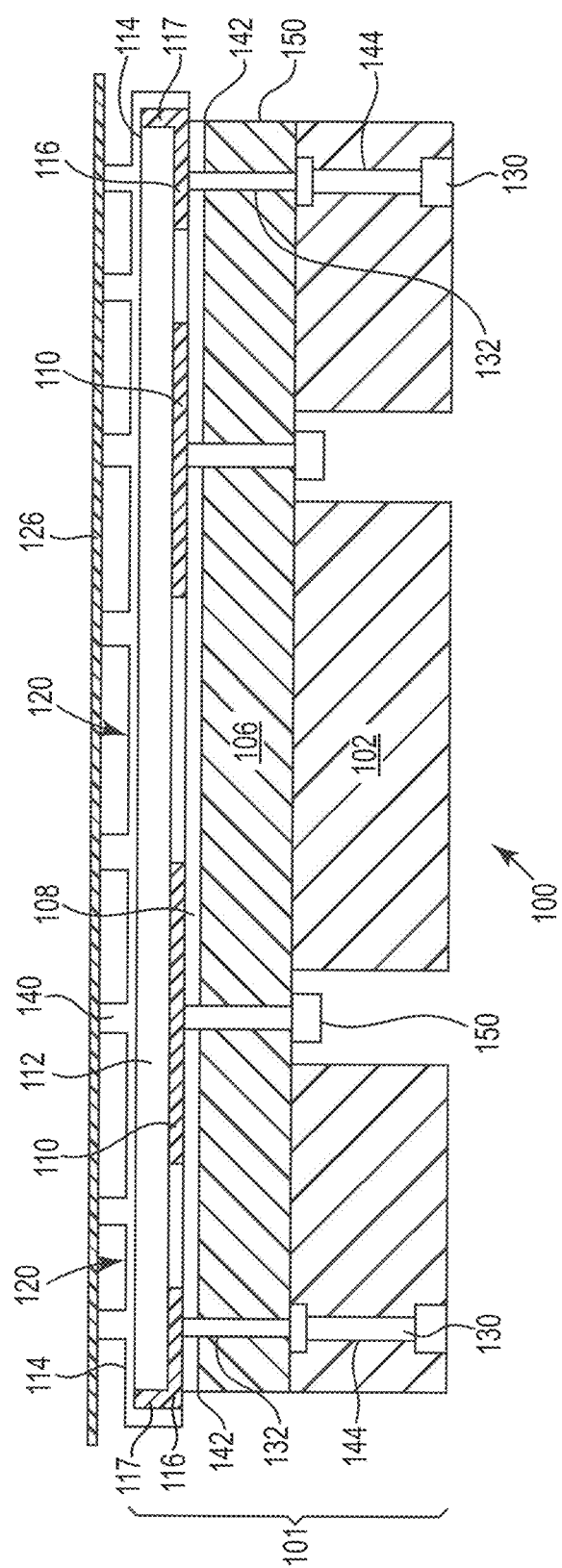
FIG. 1 is a side cut-away view of an inventive multi-layer chuck structure.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

The following detailed description should be read with reference to the drawings in which similar elements in different drawings are numbered the same. The detailed description and the drawings, which are not necessarily to scale, depict illustrative embodiments and are not intended to limit the scope of the invention. The illustrative embodiments depicted are intended only as exemplary. Selected features of any illustrative embodiment may be incorporated into an additional embodiment unless clearly stated to the contrary.

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise The term "about" generally refers to a range of numbers that is considered equivalent to the recited value (e.g., having the same function or result). In many instances, the term "about" may include numbers that are rounded to the nearest significant Figure.

Numerical ranges expressed using endpoints include all numbers subsumed within that range (e.g. 1 to 5 includes 1, 1.5, 2, 2.75, 3, 3.80, 4 and 5).

As used herein, the terms "above," "below," "top," "bottom," "upper," "lower," "vertical," and "horizontal" have meanings that are consistent with the conventional meanings of these terms, and that are consistent with the use of these terms when describing the subject matter of FIGS. 1 and 2.

The following description relates to multi-layer structures useful as an electrostatic chuck (a.k.a., a "chuck"), specifically also including any form of precursor thereof, and related methods. The multi-layer structures include a grounding structure that includes a grounding layer and a grounding pin.

The multi-layer structure includes multiple different types of layers assembled together into an electrostatic chuck. The electrostatic chuck is of a type known to be useful for supporting a substrate (e.g., semiconductor substrate or a microelectronic device or precursor thereof) during processing of the substrate, with the use of an electrostatic attractive force provided by electrodes to hold the substrate in place. Example substrates used with an electrostatic chuck include semiconductor wafers, flat screen displays, solar cells, reticles, photomasks, and the like. The substrate may have an area equal to or greater than a circular 100 millimeter diameter wafer, a 200 millimeter diameter wafer, a 300 millimeter diameter wafer or a 450 millimeter diameter wafer.

The multi-layer chuck can include layers of materials that are known as components for use in multi-layer chuck structures. The chuck includes an upper surface (a "substrate-supporting surface") that is adapted to support a substrate during processing, and includes other mechanisms and structures that include an electrode layer that generates an electrostatic attraction between the chuck and the substrate to hold the substrate in place during processing.

The substrate-supporting surface, or one or more different identifiable portions thereof, may be referred to as a "field." For example, a substrate-supporting surface may include a conductive field coating (e.g., a "field coating") that may cover an entire upper surface of the chuck, or that may alternatively cover a portion of the upper surface with a remaining portion being an exposed upper surface of the dielectric layer. The upper surface may also optionally include surface structure such as embossments.

The upper surface typically has a circular surface area with edges that define a circular perimeter, and that also define a diameter of both the surface and the multi-layer chuck. At the periphery or outer diameter of the multi-layer chuck structure is a vertical outer diameter surface that extends about the perimeter of the chuck and that is defined by the vertical surfaces of the outer edges of the multiple layers.

One layer of the multi-layer structure is an insulator layer (or "insulator" for short). The insulator layer is supported from below by a base. Above the insulator are a polymeric bonding layer and an electrode layer. Above the polymeric bonding layer and the electrode layer is a dielectric layer, which includes a chuck upper surface as described above, that includes a conductive field coating and optional embossments. The polymeric bonding layer secures an upper surface of the insulator to a bottom surface of the dielectric layer and to the electrode layer. The interface between the polymeric bonding layer and the insulator is referred to as a polymer-insulator interface.

Another layer of the multi-layer structure is a grounding layer, which connects electrically to the conductive field coating located above the grounding layer, and which is also connected to a ground path that includes a grounding pin. The grounding layer is positioned below the dielectric layer and above the polymeric bonding layer. The grounding pin electrically connects to the grounding layer by passing through other layers of the multi-layer chuck structure located below the grounding layer to access the grounding layer from a location below the grounding layer. The grounding pin connects to the grounding layer from below, while passing at a location adjacent to the polymer-insulator interface as a pin structure that is not bonded to (is not deposited onto) the vertical surfaces of the polymeric bonding layer and the insulator layer at the polymer-insulator interface.

Certain previous grounding path designs have involved a ground path in the form of a thin metal film that is secured to (e.g., by being deposited onto) a vertical outer diameter surface of a multi-layer chuck at surfaces that include the polymeric bonding layer, the insulator layer, and the polymer-insulator interface. Under certain conditions, the bond between this type of ground path and the outer diameter surface can fail and the thin film ground path separates from (e.g., delaminates from) the outer diameter surface. In comparison, a post structure as a ground path, that is not deposited onto vertical surfaces of the outer diameter of the multi-layer structure, is not susceptible to becoming separated from the surface because the pin is not initially secured to the surface by lamination or by being formed by depositing the film onto the surface.

FIG. 1 shows an illustrative example of a multi-layer chuck 100, according to an embodiment. Multi-layer chuck 100 includes a multi-layer structure having a base 102, insulator layer 106, polymer bonding layer 108, electrode layer (or "electrodes") 110, dielectric layer 112, and grounding layer 116. An upper surface of dielectric layer 112 defines wafer support surface 120, which includes conductive field coating 114 and optional embossments 140. Wafer 126 is shown as being supported by embossments 140 of wafer support surface 120. In many cases, multi-layer chuck 100 has a circular area that is defined by a circumference or periphery (not visible) that includes vertically-extending outer diameter surface 150 that is defined by vertical edge surfaces of the multiple layers.

Base 102 is a supportive layer with a flat upper surface and is made of any material effective to provide a flat rigid supportive upper surface to support insulator layer 106. Example materials may also be electrically conductive, with one specific example being aluminum.

Insulator layer 106 is supported by base 102 and can be made of any useful insulating material such as a ceramic insulating material, e.g., alumina or another useful insulating material.

Polymer bonding layer 108 is a polymer layer that is capable of providing a bond between a top surface of insulator layer 106 and a bottom surface of electrodes 110, a bottom surface of dielectric layer 112, or both, and also bonding to a bottom surface of grounding layer 116. Polymer bonding layer 108 may be made of any polymeric adhesive known as useful for bonding layers of a multi-layer electrostatic chuck. The adhesive may be a pressure-sensitive adhesive or a structural adhesive, and may be thermoplastic, thermosettable (e.g., curable), etc. The boundary between the upper surface of insulator layer 106 and the lower surface of polymer bonding layer 108 is referred to herein as the polymer-insulator interface 142.

Conductive field coating 114 can be an electrically conductive layer of material that is placed over at least a portion of an upper surface of dielectric layer 112, and may contain or may be also placed over optional embossments. Conductive field coating 114 can extend over the entire upper surface of dielectric layer 112, or over only a portion thereof. Conductive field coating 114 can be prepared from any conductive material and may be placed at a desired location by a useful method, such as a deposition method, e.g., chemical vapor deposition (and modified versions thereof such as plasma-assisted chemical vapor deposition), atomic layer deposition, and similar deposition techniques. Conductive field coating 114 may be made of a conductive material such as nickel, nickel alloy, titanium, aluminum, zirconium, titanium nitride, zirconium nitride, conductive carbon, or the like. Generally, a charge dissipation layer provides electric grounding for a workpiece (e.g., a wafer substrate) that is placed thereon, to remove, i.e., "dissipate" charge from the workpiece.

Grounding layer 116 is a conductive layer and is electrically connected to field coating 114. Grounding layer 116 can be made of any conductive material and can be prepared and placed as a layer of multi-layer chuck 100 by any useful method. In some cases, such as shown in FIG. 1, grounding layer 116 is located between an upper surface of polymer binding layer 108 and a lower surface of dielectric layer 112. For example, as shown in FIG. 1, lower surface grounding layer 116 contacts an upper surface of the polymer binding layer 108, and an upper surface of the grounding layer 116 contacts a lower surface of the dielectric layer 112. Optionally, as illustrated, grounding layer 116 can also include an extended portion 117 that contacts vertical outer diameter surface 150 of dielectric layer 112 to facilitate electric contact between grounding layer 116 and conductive field coating 114.

The material of grounding layer 116 can be any conductive material. Examples of suitable conductive materials include, but are not limited to nickel, nickel alloy, titanium, aluminum, zirconium, titanium nitride, zirconium nitride, or conductive carbon.

Relative to the two-dimensional surface area of the multi-layer structure (i.e., the area of the structure when viewed from above or below, such as the two-dimensional area of upper wafer support surface 120), grounding layer 116 may be placed at any effective portion of that surface area. In particular, grounding layer 116 is electrically connected with the conductive field coating 114 located above grounding layer 116, and is also be in electrical contact with the grounding pin 132 located below grounding layer 116.

One useful location for a grounding layer relative to the surface area of the chuck is at a perimeter of a multi-layer chuck (e.g., multi-layer chuck 100), adjacent to an edge of the chuck at an outer diameter. The location at the outer edge of the surface of the chuck allows the grounding layer to have nearby access to the conductive field coating by a grounding path located at the outer surface of the dielectric layer.

Grounding layer 116 can have dimensions and a location that allow the grounding layer to function as described and to be electrically connected to both the grounding pin and the conductive field coating. Grounding layer 116 located at an outer edge of the surface area of a multi-layer chuck can be considered to have a width dimension extending from the outer edge (periphery) of the area, a distance toward the center of the area. The magnitude of this width dimension can be sufficient to allow a grounding pin to be placed below the grounding layer as part of the multi-layer chuck. The size of the width dimension can also depend on the total area of the chuck. A useful width of a grounding layer may be up to 10 percent of a diameter of a chuck. For a chuck of 100 millimeters in diameter, a useful width may be up to 10 millimeters. Alternate width dimensions may be in a range from 10 nanometers to 100 micrometers.

Grounding layer 116 can have any effective thickness, such as a thickness in a range from 100 nanometers to 10 micrometers.

Examples of methods of placing grounding layer 116 at a desired location relative to other layers of the multi-layer structure include known deposition methods such as chemical vapor deposition (and modified versions thereof such as plasma-assisted chemical vapor deposition), physical vapor deposition, atomic layer deposition, and similar deposition techniques.

Still referring to FIG. 1, multi-layer chuck structure 101 includes grounding pin 132 that contacts grounding layer 116 from a location below the grounding layer 116, and at a location above polymer-insulator interface 142. In some cases, grounding pin 132 may contact a lower surface of grounding layer 116 at a location at which a lower surface of grounding layer 116 contacts an upper surface of polymer bonding layer 108. Grounding pin 132 passes by a side of interface 142 as a solid pin structure that is not required to be deposited onto, adhered to, or otherwise secured to interface 142, and may even avoid contacting one or more of the surfaces of interface 142. Grounding pin 132 may be inserted into and reside within a grounding pin opening 144 in the multi-layer structure 101 that is prepared for the purpose of containing grounding pin 132. Grounding pin opening 144 can extend from a location below grounding layer 116, through one or more layers and materials of multi-layer structure 101, for example through polymer bonding layer 108, through all or a portion of insulator layer 106, and through all or a portion of base layer 102. Base layer 102 may include a grounding screw (e.g. grounding screw 130), as shown.

Grounding pin 132 can be made of any electrically conductive material such as a rigid metal, and can be formed as an elongate metal shaft. Grounding pin 132 can be assembled and incorporated into the multi-layer structure 101 with a grounding screw 130, wherein a opposed engaged surfaces of grounding pin 132 and grounding screw 130 produce a threaded engagement. The structures and placement of grounding pin 132 and grounding screw 130 can be as needed, with examples of these devices being known in the field of electrostatic chucks designs. According to a single example, grounding screw 130 can be secured (e.g., by a threaded engagement) with a cavity in a base (e.g., of aluminum) of a multi-layer chuck. In some embodiments, the engagement between grounding pin 132 and grounding screw 130 can be a metallic spring, a bond with an electrically conductive epoxy, or another form of electrical connection. Grounding pin 132 can be passed from below through a cavity formed in the insulator layer 106 and polymer bonding layer 108 to contact electrode(s) 110 indirectly through an electrically conductive material such as an electrically-conductive epoxy.

Other features of a multi-layer chuck 100 include electrodes 110 and optional embossments 140, as depicted in FIG. 1. Useful electrodes 110 of multi-layer electrostatic chucks are known, and an electrode 110 for use in a multi-layer chuck as described can be selected from known examples. Electrodes 110 are capable of accumulating an electric charge to produce an attractive (downward) electrostatic force between the electrodes and a substrate placed on the substrate-support surface of a chuck. Thus, electrodes 110 are connected to an electric circuit capable of selectively providing an electric charge to electrodes 110, and are connected or selectively connectable to ground, but are not electrically connected to conductive field coating 114.

Electrodes 110 may be placed at a desired location relative to other layers of the multi-layer structure 101, and over a desired portion (e.g., pattern) of area of the chuck, by any useful method, such as by deposition, e.g., chemical vapor deposition (and modified versions thereof such as plasma-assisted chemical vapor deposition), atomic layer deposition, and similar deposition techniques. Electrodes 110 may typically be patterned over the surface area of the chuck (when viewed from above) and need not cover the entire surface area of the chuck.

Optional embossments 140 are surface structure located at the substrate-support surface, to support the substrate a distance away from the upper layer of the dielectric layer. Embossments 140 can be located above or below a conductive field coating, and may be sized and spaced in any useful manner. Useful examples of embossments for use on a substrate-supporting surface of a multi-layer chuck are known. Example materials useful as an embossment may be conductive (e.g., metal) or insulative (e.g., dielectric, such as an insulative ceramic). Embossments 140 may be placed at a desired location relative to the dielectric layer by any useful method such as a deposition method, e.g., chemical vapor deposition (and modified versions thereof such as plasma-assisted chemical vapor deposition), atomic layer deposition, and similar deposition techniques.

To prepare a multi-layer chuck as illustrated, a method does not require a ground path formed onto a vertical surface of the multi-layer chuck, such as onto one or more vertical edge surfaces of insulator layer 106, polymer bonding layer 108, or polymer-insulator interface 142. Instead, a grounding pin may be placed as described by providing a multi-layer chuck structure, or a precursor thereof, that includes at least the insulator, the grounding layer, and the polymer bonding layer, and preparing a grounding pin opening (e.g. grounding pin opening 144) in the multi-layer structure 101. With reference to FIG. 1, an example grounding pin opening 144 can extend from a location below (e.g., at a lower surface of) grounding layer 116, through one or more layers and materials of multi-layer chuck 100, for example through polymer bonding layer 108, through all or a portion of insulator layer 106, and through all or a portion of a base layer 102. Base layer 102 may include a grounding screw (e.g. grounding screw 130), as shown, that is engaged with grounding pin 132. After forming the grounding pin opening 144, a grounding pin (e.g. grounding screw 132) can be inserted (from below the insulator layer 106 or base 102) into the grounding pin opening 144 to place an upper end of grounding pin 132 in electric contact with grounding layer 116, on the bottom side of grounding layer 116.

Figure 2:
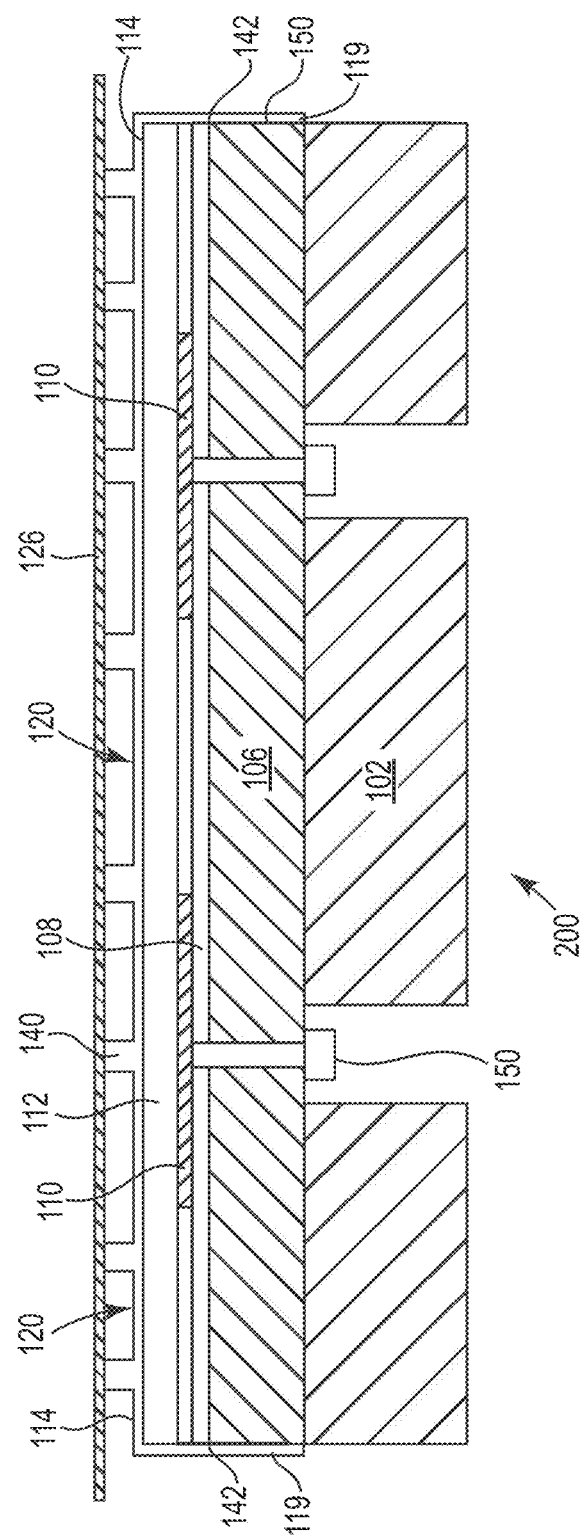
FIG. 2 is a side cut-away view of a prior art multi-layer chuck structure.

As a comparison, examples of alternative (previous) grounding path structures include deposited thin metal films placed on an outside diameter surface of a multi-layer chuck such as, for example, multi-layer chuck 200 shown in FIG. 2. As depicted in FIG. 2, multi-layer chuck 200 includes a deposited thin metal film grounding path 119 adhered to vertically-extending outer diameter surface 150. Grounding path 119 eventually connects to electrical ground, by any effective route. Thin film metal grounding path 119 may be placed on outer diameter surface 150 by being formed on the outer diameter surface (e.g., by a deposition method). These previous deposited thin film structures must be well secured to the outer diameter surface, including a surface of each layer and each interface between adjacent layers. For example, as shown in FIG. 2, a deposited thin film structure may be required to adhere to an outer diameter surface by traversing a polymer-insulator interface 142. This type of thin film grounding path placed onto outer surface 150 can be susceptible to delamination or other separation from surface 150 during use or over time. The embodiments described herein with reference to FIG. 1, provide a different ground path that involves a grounding pin that is not deposited onto the outer diameter surface of a multi-layer chuck, and that is not at risk of delamination from that surface.

Aspects:

Aspect 1 is a multi-layer electrostatic chuck assembly comprising: a dielectric layer, a conductive field coating above the dielectric layer, an electrode layer below the dielectric layer, an insulator layer below the electrode layer, a polymeric bonding layer below the dielectric layer and above the insulator layer, a grounding layer above the polymeric bonding layer, below the dielectric layer, and electrically connected to the conductive field coating, a grounding pin opening extending from a location of the insulator, through the polymeric bonding layer to the grounding layer, and a grounding pin located in the grounding pin opening, the grounding pin being electrically connected to the grounding layer.

Aspect 2 includes the assembly according to aspect 1, wherein the grounding layer contacts an upper surface of the polymeric bonding layer and a lower surface of the dielectric layer.

Aspect 3 includes the assembly according to aspects 1 or 2, wherein the grounding layer is an electrically conducting deposited thin film.

Aspect 4 includes the assembly of aspects 1 or 2, wherein the grounding layer is a deposited thin film comprising nickel, nickel alloy, titanium, aluminum, zirconium, titanium nitride, zirconium nitride, or conductive carbon.

Aspect 5 includes the assembly according to any one of aspects 1 through 4, wherein the grounding layer has a thickness in a range from 100 nanometers to 10 micrometers and a width in a range from 10 nanometers to 100 micrometers.

Aspect 6 includes the assembly according to any one of aspects 1 through 5, wherein the grounding layer extends without interruption around a complete perimeter of the assembly.

Aspect 7 includes the assembly according to any one of aspects 1 through 6, wherein the grounding layer is electrically connected to the conductive field coating by a conductive ground path that extends from the conductive field coating and over an outer diameter surface of the dielectric layer, to connect to the grounding layer.

Aspect 8 includes the assembly according to any one of aspects 1 through 7 comprising a base below the insulator, that supports the insulator.

Aspect 9 includes the assembly according to any one of aspects 1 through 8 comprising embossments at an upper surface.

Aspect 10 is a method including forming a grounding pin opening in a multi-layer structure including a dielectric layer, an electrode layer disposed below the dielectric layer, an insulator layer below the electrode layer, a polymeric bonding layer disposed below the dielectric layer and the electrode layer and above the insulator layer, and a grounding layer disposed above the polymeric bonding layer, below the dielectric layer, and electrically connected to the field coating, the grounding pin opening extending from a location of the insulator layer, through the polymeric bonding layer and to the grounding layer; and inserting a grounding pin into the grounding pin opening and electrically connecting the grounding pin to the grounding layer.

Aspect 11 includes the method of aspect 10, wherein the multi-layer structure comprises a conductive field coating above the dielectric layer, and the grounding layer is electrically connected to the conductive field coating.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in details, particularly in matters of shape, size, and arrangement of parts without exceeding the scope of the disclosure. The disclosure's scope is, of course, defined in the language in which the appended claims are expressed.

What is claimed is:

1. A multi-layer electrostatic chuck assembly comprising:
   a dielectric layer;
   a conductive field coating above the dielectric layer;
   an electrode layer below the dielectric layer;
   an insulator layer below the electrode layer;
   a polymeric bonding layer below the dielectric layer and above the insulator layer;
   a grounding layer above the polymeric bonding layer, below the dielectric layer, and electrically connected to the conductive field coating;
   a grounding pin opening extending from a location of the insulator, through the polymeric bonding layer to the grounding layer; and
   a grounding pin located in the grounding pin opening, the grounding pin being electrically connected to the grounding layer.

2. The assembly of claim 1, wherein the grounding layer contacts an upper surface of the polymeric bonding layer and a lower surface of the dielectric layer.

3. The assembly of claim 1, wherein the grounding layer is an electrically conducting deposited thin film.

4. The assembly of claim 1, wherein the grounding layer is a deposited thin film comprising nickel, nickel alloy, titanium, aluminum, zirconium, titanium nitride, zirconium nitride, or conductive carbon.

5. The assembly of claim 1, wherein the grounding layer has a thickness in a range from 100 nanometers to 10 micrometers and a width in a range from 10 nanometers to 100 micrometers.

6. The assembly of claim 1, wherein the grounding layer extends without interruption around a complete perimeter of the assembly.

7. The assembly of claim 1, wherein the grounding layer is electrically connected to the conductive field coating by a conductive ground path that extends from the conductive field coating and over an outer diameter surface of the dielectric layer, to connect to the grounding layer.

8. The assembly of claim 1, further comprising a base below the insulator, that supports the insulator.

9. The assembly of claim 1, further comprising embossments at an upper surface.

10. A method comprising:
    forming a grounding pin opening in a multi-layer structure including a dielectric layer, an electrode layer disposed below the dielectric layer, an insulator layer below the electrode layer, a polymeric bonding layer disposed below the dielectric layer and the electrode layer and above the insulator layer, and a grounding layer disposed above the polymeric bonding layer, below the dielectric layer, and electrically connected to the field coating, the grounding pin opening extending from a location of the insulator layer, through the polymeric bonding layer and to the grounding layer; and
    inserting a grounding pin into the grounding pin opening and electrically connecting the grounding pin to the grounding layer.

11. The method of claim 10, wherein the multi-layer structure comprises a conductive field coating above the dielectric layer, and the grounding layer is electrically connected to the conductive field coating.

* * * * *